United States Patent
Cheng et al.

(10) Patent No.: US 7,939,876 B2
(45) Date of Patent: May 10, 2011

(54) METALLIZED CONDUCTIVE STRAP SPACER FOR SOI DEEP TRENCH CAPACITOR

(75) Inventors: Kangguo Cheng, Guilderland, NY (US); Byeong Y. Kim, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 12/100,018

(22) Filed: Apr. 9, 2008

(65) Prior Publication Data

US 2009/0256185 A1 Oct. 15, 2009

(51) Int. Cl.
*H01L 27/108* (2006.01)
*H01L 29/94* (2006.01)
*H01L 29/76* (2006.01)
*H01L 31/119* (2006.01)

(52) U.S. Cl. . 257/301; 257/296; 257/347; 257/E29.345; 257/E21.646

(58) Field of Classification Search .......................... None
See application file for complete search history.

(56) References Cited

U.S. PATENT DOCUMENTS

| 4,988,637 | A | * | 1/1991 | Dhong et al. | 438/245 |
| 5,804,851 | A | * | 9/1998 | Noguchi et al. | 257/304 |
| 6,090,660 | A | * | 7/2000 | Noble, Jr. | 438/243 |
| 6,472,702 | B1 | * | 10/2002 | Shen | 257/301 |
| 6,930,012 | B2 | * | 8/2005 | Matsubara | 438/392 |
| 6,953,961 | B2 | * | 10/2005 | Lee et al. | 257/301 |

* cited by examiner

*Primary Examiner* — Zandra Smith
*Assistant Examiner* — Khanh B Duong
(74) *Attorney, Agent, or Firm* — Scully, Scott, Murphy & Presser, P.C.; H. Daniel Schnurmann

(57) ABSTRACT

A conductive strap spacer is formed within a buried strap cavity above an inner electrode recessed below a top surface of a buried insulator layer of a semiconductor-on-insulator (SOI) substrate. A portion of the conductive strap spacer is metallized by reacting with a metal to form a strap metal semiconductor alloy region, which is contiguous over the conductive strap spacer and a source region, and may extend to a top surface of the buried insulator layer along a substantially vertical sidewall of the conductive strap spacer. The conductive strap spacer and the strap metal semiconductor alloy region provide a stable electrical connection between the inner electrode of the deep trench capacitor and the source region of the access transistor.

9 Claims, 11 Drawing Sheets

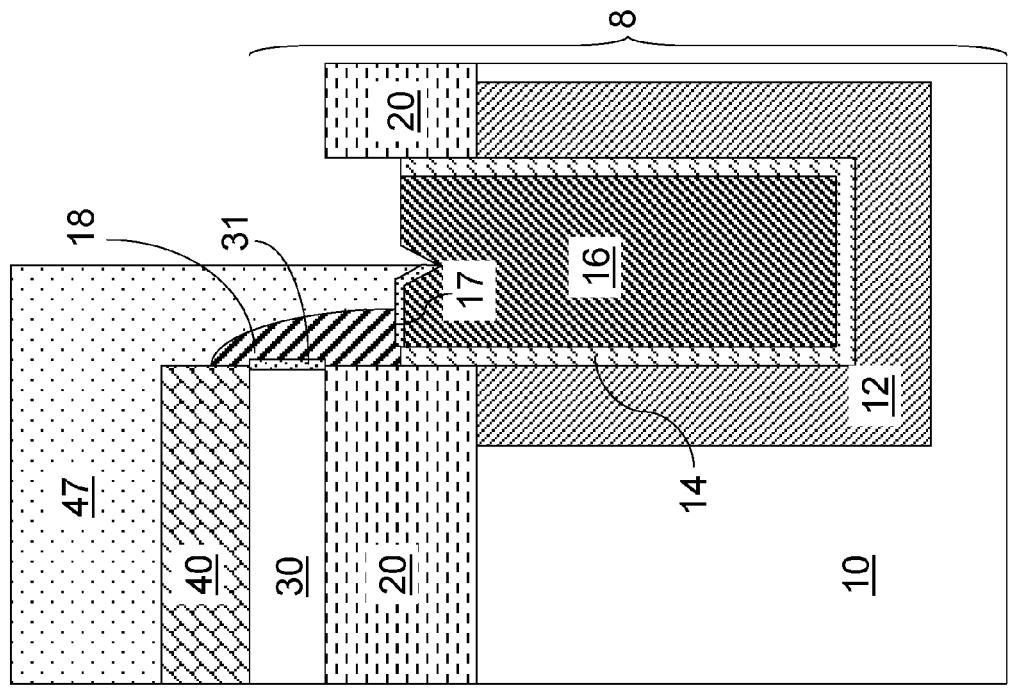
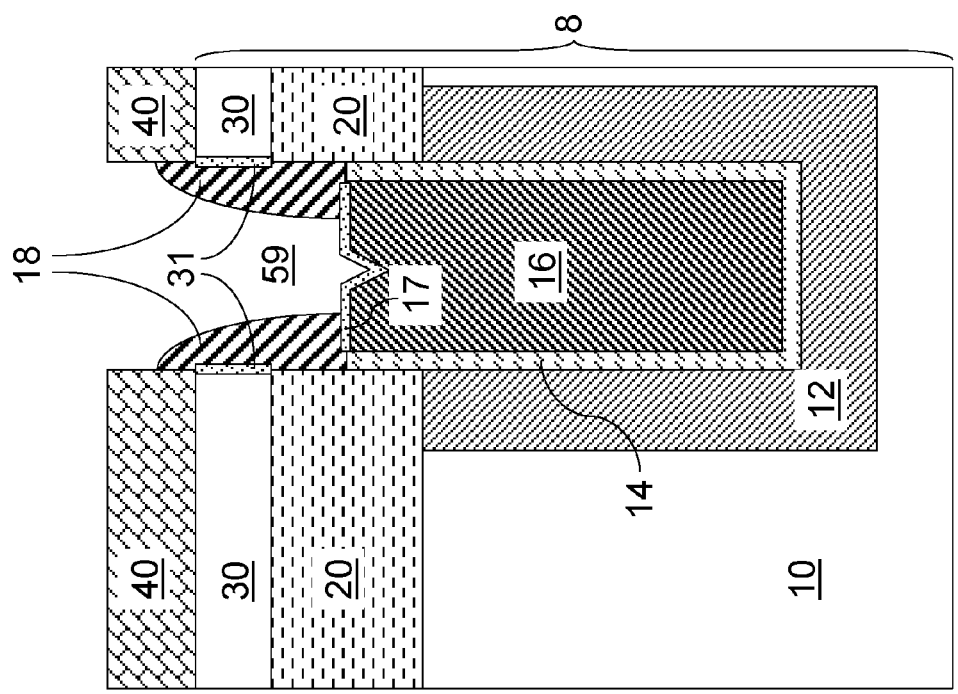

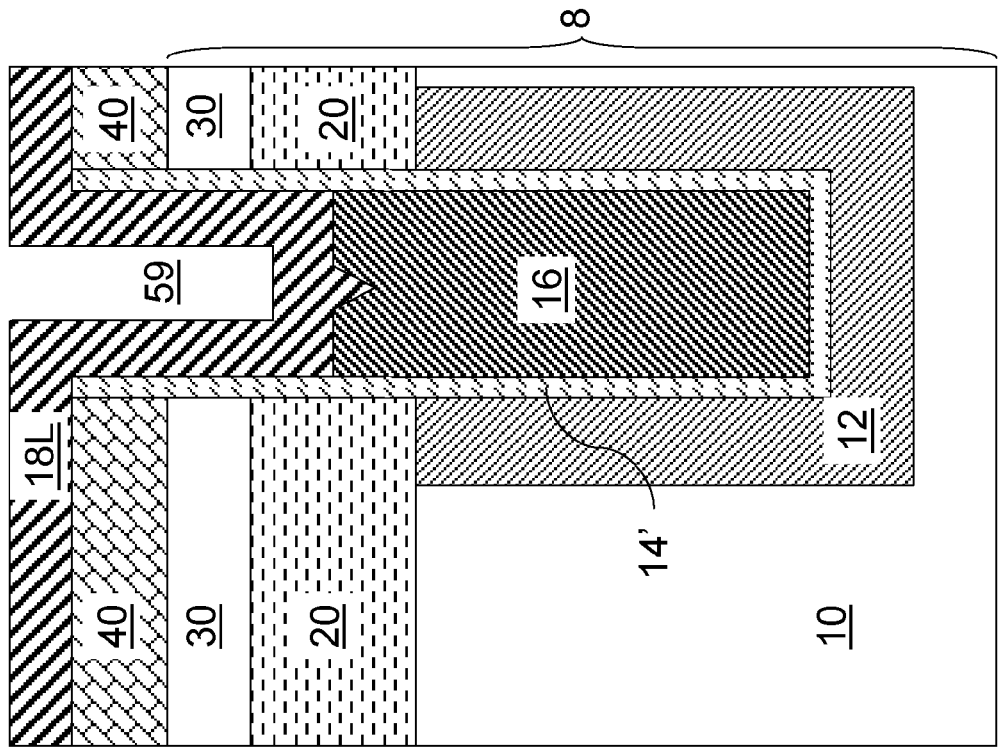
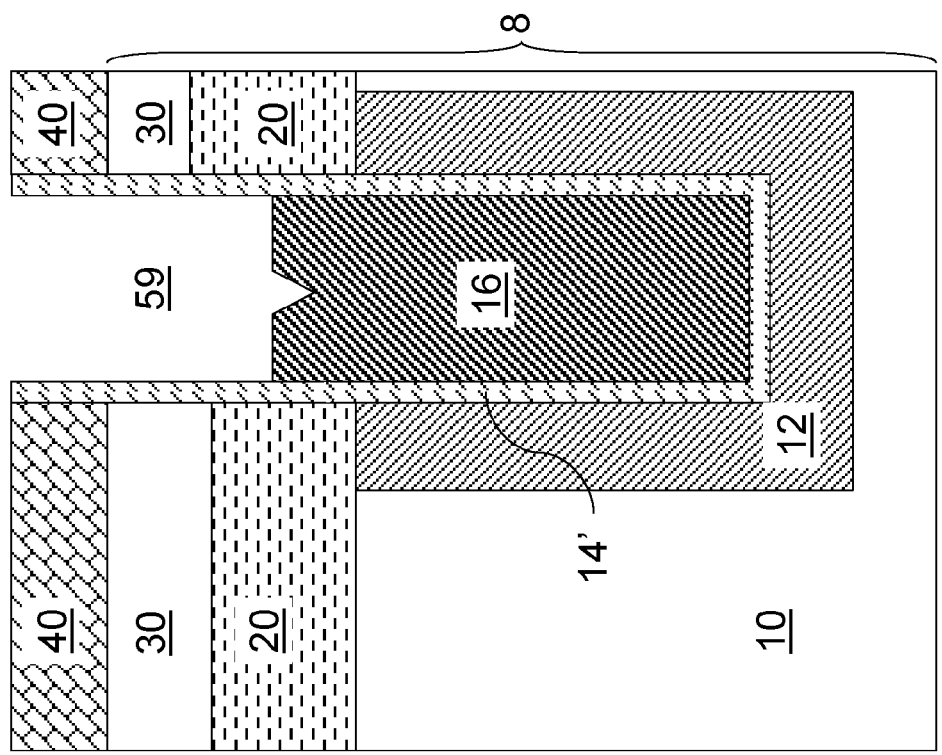
FIG. 14
FIG. 13

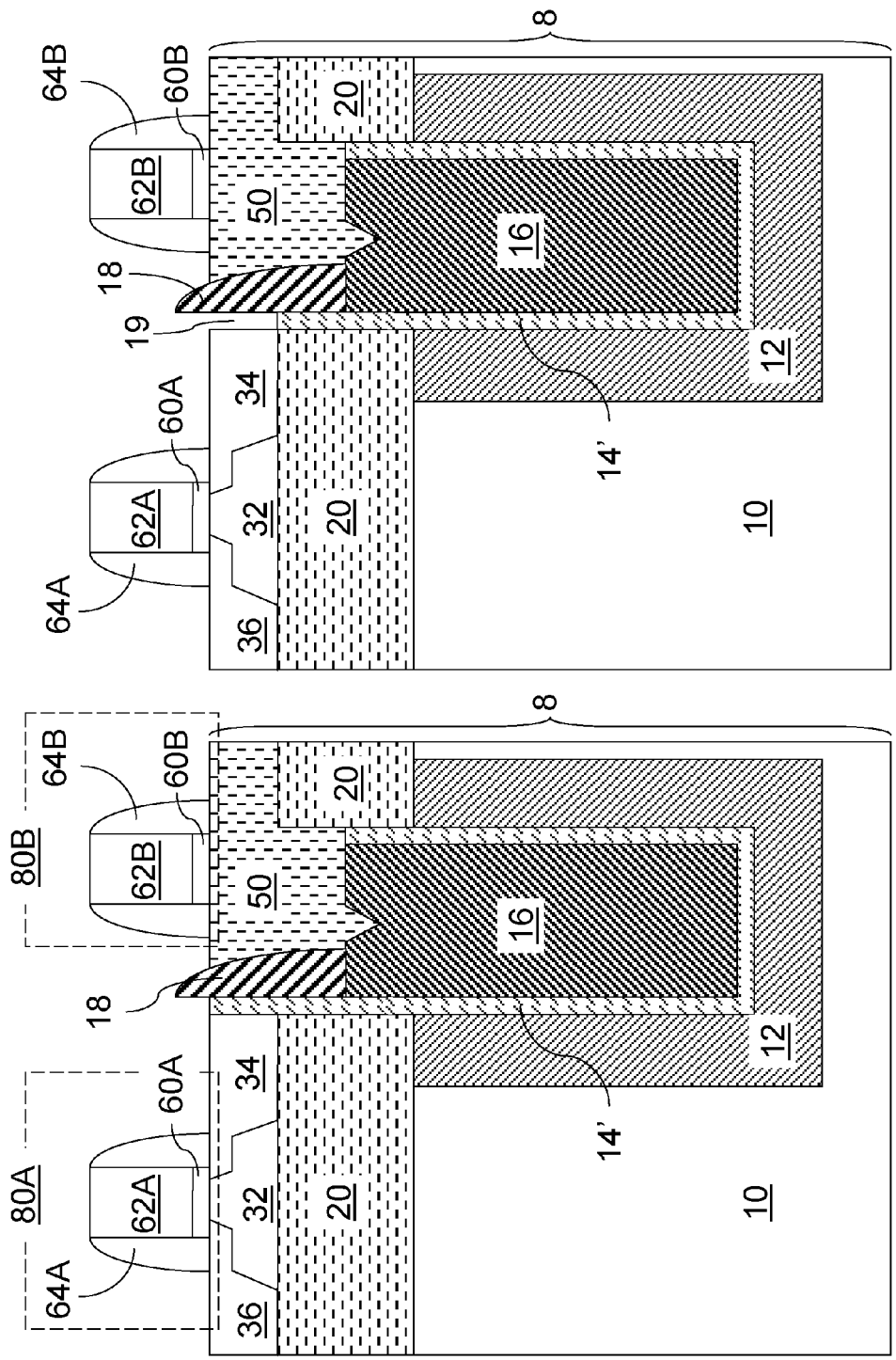

US 7,939,876 B2

METALLIZED CONDUCTIVE STRAP SPACER FOR SOI DEEP TRENCH CAPACITOR

FIELD OF THE INVENTION

The present invention relates to a semiconductor structure, and particularly to a deep trench capacitor in a semiconductor-on-insulator (SOI) substrate including a metallized buried spacer, and methods of manufacturing the same.

BACKGROUND OF THE INVENTION

Deep trench capacitors are used in a variety of semiconductor chips for high areal capacitance and low device leakage. Typically, a deep trench capacitor provides a capacitance in the range from about 4 fF (femto-Farad) to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Semiconductor-on-insulator (SOI) devices formed on an SOI substrate or on a hybrid substrate provide high performance in advanced semiconductor chips. In SOI devices, the capacitive coupling between a substrate and semiconductor devices is reduced by the presence of a buried insulator layer. By forming a deep trench capacitor in the SOI substrate, SOI logic devices such as SOI transistors and deep trench capacitors may be formed on the same SOI substrates thereby enabling embedding of deep trench capacitors into the SOI substrate that also contain high performance SOI logic devices. Such embedded deep trench capacitors enable various functionality including embedded dynamic access memory (eDRAM) and other embedded electronic components requiring a capacitor.

High performance SOI devices employ an SOI substrate having a thin top semiconductor layer having a thickness from about 3 nm to about 100 nm. Such an SOI substrate is referred to as an ultrathin SOI (UTSOI) substrate. Despite such enhanced performance, however, such UTSOI substrates presents a difficulty in the formation of a buried strap employed to electrically connect the deep trench capacitor to an access transistor, which is required in an embedded DRAM cell or other devices in which electrical connection to the deep trench capacitor is controlled by an access transistor.

Specifically, difficulty in recess control of a conductive fill material arises as the thickness of a top semiconductor layer is reduced below the 100 nm range. On one hand, if the recess depth of the conductive fill material falls below the bottom surface of the top semiconductor layer, or an "UTSOI layer," the conductive fill material does not make contact with the top semiconductor layer, and as a consequence, the inner electrode of the deep trench is electrically disconnected from the access transistor in the top semiconductor layer. On the other hand, if the recess depth is less than a minimum distance below the top surface of the top semiconductor layer, the thickness of the portion of a shallow trench isolation structure above the buried strap comprising the conductive fill material decreases below a minimum value. In this case, the leakage current between a passing word line over the shallow trench isolation structure and the buried strap increases to degrade the performance of the device incorporating the deep trench capacitor or even render the device non-functional.

In view of the above, there exists a need for a semiconductor structure incorporating a deep trench capacitor having a reliable and stable contact between the inner electrode of the deep trench capacitor and an access transistor in a semiconductor-on-insulator (SOI) substrate and methods of manufacturing the same.

Further, there exists a need for a semiconductor structure incorporating a deep trench capacitor having a buried strap structure providing stable and process-variation-independent electrical contact between the inner electrode and the access transistor in a semiconductor-on-insulator (SOI) substrate having an UTSOI layer and methods of manufacturing the same.

SUMMARY OF THE INVENTION

The present invention addresses the needs described above by providing a semiconductor structure comprising a deep trench capacitor having a conductive strap spacer that is formed on a sidewall of a top semiconductor layer, and methods of manufacturing the same.

In the present invention, a conductive strap spacer is formed within a buried strap cavity above an inner electrode recessed below a top surface of a buried insulator layer of a semiconductor-on-insulator (SOI) substrate. The conductive strap spacer comprises a doped semiconductor material, and is formed on a sidewall of a top semiconductor layer and may protrude above a top surface of the top semiconductor layer. After formation of a shallow trench isolation structure and an access transistor abutting the deep trench, a portion of the conductive strap spacer is metallized by reacting with a metal to form a strap metal semiconductor alloy region, which is contiguous over the conductive strap spacer and a source region, and may extend to a top surface of the buried insulator layer along a substantially vertical sidewall of the conductive strap spacer. The conductive strap spacer and the strap metal semiconductor alloy region provide a stable electrical connection between the inner electrode of the deep trench capacitor and the source region of the access transistor without requiring a precise depth control in recess etch steps.

According to an aspect of the present invention, a method of forming a semiconductor structure is provided, which comprises:

forming a deep trench in a semiconductor-on-insulator (SOI) substrate;

forming an inner electrode in the deep trench; and forming a conductive strap spacer on a sidewall of a top semiconductor layer, on the inner electrode, and within the deep trench, wherein a top portion of the conductive strap spacer is located above a top surface of the top semiconductor layer.

In one embodiment, the method further comprises:

forming a node dielectric layer directly on sidewalls of the deep trench;

recessing the node dielectric layer to a depth substantially coplanar with a top surface of the inner electrode prior to forming the conductive strap spacer;

forming a field effect transistor comprising a source region; and forming a strap metal semiconductor alloy region abutting the conductive strap spacer and the source region and located over a top surface of the top semiconductor layer by metallizing a portion of the conductive strap spacer and a portion of the source region.

In another embodiment, the method further comprises:

forming a pad dielectric layer atop the top semiconductor layer;

forming a node dielectric extending from a sidewall of the pad dielectric layer to a bottom surface of the deep trench, wherein the conductive strap spacer is formed directly on the inner electrode and the node dielectric and is separated from the top semiconductor layer, a buried insulator layer, and the pad dielectric layer by the node dielectric;

forming a field effect transistor comprising a source region, wherein the source region laterally abuts the node dielectric;

recessing the node dielectric and exposing a sidewall of the source region and a sidewall of the conductive strap spacer beneath a top surface of the top semiconductor layer; and forming a strap metal semiconductor alloy region abutting the sidewall of the source region and the sidewall of the conductive strap spacer by metallizing a portion of the conductive strap spacer and a portion of the source region.

According to another aspect of the present invention, a semiconductor structure is provided, which comprises a deep trench located in a semiconductor-on-insulator (SOI) substrate;

an inner electrode located inside the deep trench and beneath a top surface of a buried insulator layer;

a conductive strap spacer abutting a sidewall of the buried insulator layer and protruding above a top surface of a top semiconductor layer; and a strap metal semiconductor alloy region abutting the conductive strap spacer and a top surface of the top semiconductor layer.

In one embodiment, an entirety of said strap metal semiconductor alloy region is located a top surface of the top semiconductor layer In another embodiment, the strap metal semiconductor alloy region abuts a sidewall of the top semiconductor layer and a substantially vertical sidewall of the conductive strap spacer beneath the top surface of the top semiconductor layer.

BRIEF DESCRIPTION OF THE DRAWINGS

FIGS. 1-11 are sequential vertical cross-sectional views of a first exemplary semiconductor structure according to a first embodiment of the present invention.

FIG. 1 corresponds to a step after formation of a buried plate 12.

FIG. 2 corresponds to a step after formation of a conductive material layer 16L.

FIG. 3 corresponds to a step after formation of an inner electrode 16 and a node dielectric 14.

FIG. 4 corresponds to a step after formation of a doped semiconductor material layer 18L.

FIG. 5 corresponds to a step after formation of a first interfacial dielectric layer 17, a second interfacial dielectric layer 31, and a conductive strap spacer 18.

FIG. 6 corresponds to a step after patterning of a shallow trench 47.

FIG. 7 corresponds to a step after formation of a shallow trench fill dielectric layer 50L.

FIG. 8 corresponds to a step after formation of a shallow trench isolation structure 50.

FIG. 9 corresponds to a step after recessing of the shallow trench isolation structure and removing pad dielectric layer 40.

FIG. 10 corresponds to a step after formation of an active word line 80A and a passing word line 80B.

FIG. 11 corresponds to a step after formation of various metal semiconductor alloy regions and a middle-of-line (MOL) dielectric layer 90.

FIGS. 13-19 are sequential vertical cross-sectional views of a third exemplary semiconductor structure according to a third embodiment of the present invention.

FIG. 13 corresponds to a step after formation of an inner electrode 16 and a node dielectric 14'.

FIG. 14 corresponds to a step after formation of a doped semiconductor material layer 18L.

FIG. 15 corresponds to a step after formation of a conductive strap spacer 31.

FIG. 16 corresponds to a step after formation of a shallow trench isolation structure 50.

FIG. 17 corresponds to a step after formation of an active word line 80A and a passing word line 80B.

FIG. 18 corresponds to a step after recessing the node dielectric 14' beneath the top surface of the top semiconductor layer to form a divot 19.

FIG. 19 corresponds to a step after formation of various metal semiconductor alloy regions and a middle-of-line (MOL) dielectric layer 90.

FIGS. 20 and 21 are sequential vertical cross-sectional views of a fourth exemplary semiconductor structure according to a fourth embodiment of the present invention. FIG. 20 corresponds to a step after formation of an expanded divot 19'. FIG. 20 corresponds to a step after formation of various metal semiconductor alloy regions and a middle-of-line (MOL) dielectric layer 90.

DETAILED DESCRIPTION OF THE INVENTION

Figure 2:
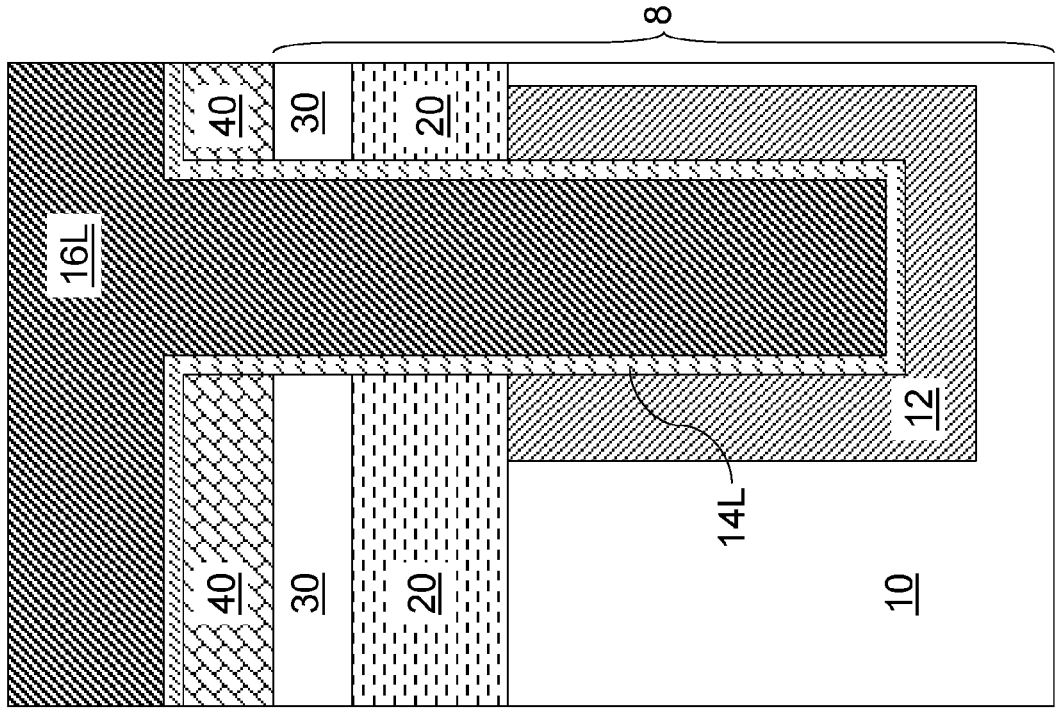

As stated above, the present invention relates to a deep trench capacitor in a semiconductor-on-insulator (SOI) substrate including a metallized buried spacer and methods of manufacturing the same, which are now described in detail with accompanying figures. It is noted that like reference numerals refer to like elements across different embodiments.

Figure 1:
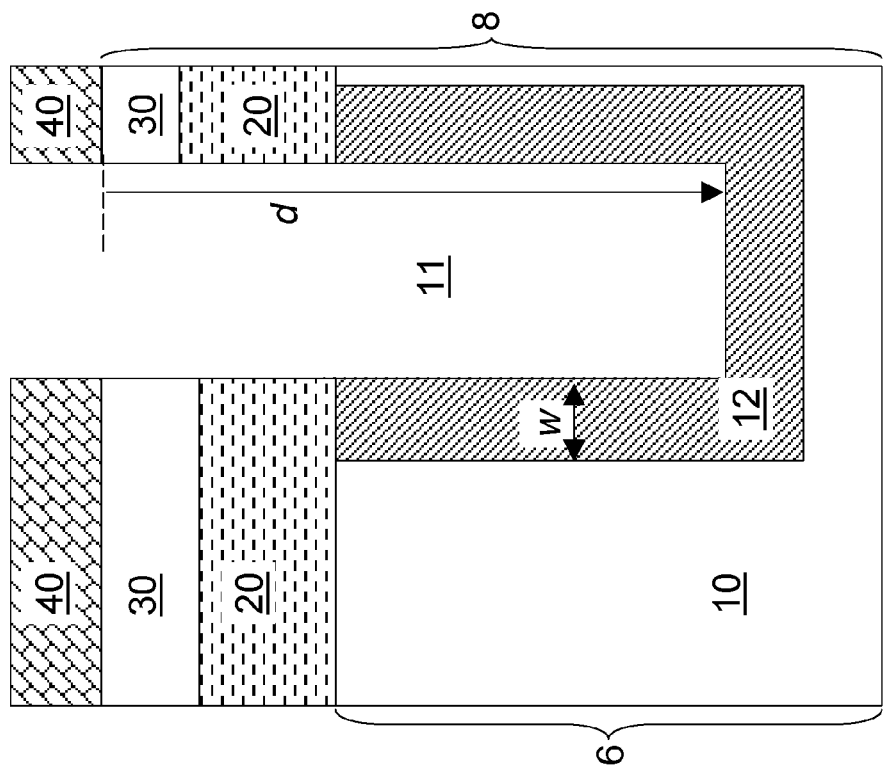

Referring to FIG. 1, a first exemplary semiconductor structure according to a first embodiment of the present invention comprises a semiconductor-in-insulator (SOI) substrate 8 containing a top semiconductor layer 30, a buried insulator layer 20, and a bottom semiconductor layer 6. Each of the top semiconductor layer 30 and the bottom semiconductor layer 6 comprises a semiconductor material. The semiconductor material of the top semiconductor layer 30 and the semiconductor material of the bottom semiconductor layer 6 may be the same, or different. The semiconductor materials for the top semiconductor layer 30 and the bottom semiconductor layer 6 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor materials comprise silicon.

Preferably, the top semiconductor layer 30 comprises a single crystalline material having an epitaxial alignment throughout an entirety of the top semiconductor layer 30. However, embodiments in which the top semiconductor layer 30 and/or the bottom semiconductor layer 6 comprise at least one polycrystalline or amorphous semiconductor material are contemplated herein also. Preferably, the bottom semiconductor layer 6 also comprises a single crystalline material having an epitaxial alignment throughout an entirety of the bottom semiconductor layer 6. The semiconductor portion 10 has a doping of a first conductivity type at a dopant concentration from about $1.0\times10^{14}/cm^3$ to about $1.0\times10^{19}/cm^3$, and typically from about $1.0\times10^{14}/cm^3$ to about $1.0\times10^{17}/cm^3$. While the present invention is described with an SOI substrate 8, implementation of the present invention in an SOI portion of a hybrid substrate is explicitly contemplated herein. The thickness of the top semiconductor layer 30 may be from about 3 nm to about 300 nm, and typically from about 10 nm to about 100 nm, although lesser and greater thicknesses are contemplated herein also.

The buried insulator layer 20 vertically abuts a top surface of the bottom semiconductor layer 6 and a bottom surface of the top semiconductor layer 30. The buried insulator layer 20 comprises a dielectric material such as silicon oxide, silicon nitride, silicon oxynitride, or a stack thereof. Typically, the buried insulator layer 20 comprises silicon oxide. The thickness of the buried insulator layer 20 may be from about 10 nm to about 600 nm, and typically from about 30 nm to about 200 nm, although lesser and greater thickness are contemplated herein also.

A pad dielectric layer 40 is formed on the top surface of the top semiconductor layer 30. The pad dielectric layer 40 may comprise a dielectric oxide, a dielectric nitride, a dielectric oxynitride, or a combination thereof. For example, the pad dielectric layer 40 may comprise a stack of a silicon oxide layer (not shown separately) abutting a top surface of the top semiconductor layer 30 and a silicon nitride layer (not shown separately) located directly on the silicon oxide layer. In this case, the silicon oxide layer may have a thickness from about 1 nm to about 30 nm, and typically from about 3 nm to about 12 nm. The silicon nitride layer may have a thickness from about 40 nm to about 300 nm, and typically from about 80 nm to about 200 nm, although lesser and greater thicknesses are contemplated herein also. Typically, the pad dielectric layer 40 may be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc.

A masking layer (not shown) is formed above the pad dielectric layer 40 and the photoresist to function as a hard mask. The masking layer may comprise a silicon oxide based material such as undoped silicate glass (USG), a borosilicate glass (BSG), etc. A photoresist (not shown) is applied over the masking layer and a lithographic pattern containing a hole is formed in the photoresist. The pattern in the photoresist is transferred by a first anisotropic etch into the pad dielectric layer 40, the top semiconductor layer 30, the buried insulator layer 20, and an upper portion of the bottom semiconductor layer 6. The photoresist is removed selective to the masking layer. The depth d of the deep trench 11 after the second anisotropic etch, as measured from the top surface of the top semiconductor layer 30 to a bottom surface of the deep trench 11, may be from about 2 μm to about 10 μm, and typically from about 4 μm to about 8 μm. Optionally, the portion of the deep trench 11 in the bottom semiconductor layer 6 may be laterally expanded underneath the bottom surface of the buried insulator layer 20 by an isotropic etch, which may be a wet etch or a dry etch.

A buried plate 12 is formed by introducing dopant of a second conductivity type through the sidewalls and the bottom surface of the portion of the deep trench 11 into a portion of the bottom semiconductor layer 6 laterally surrounding and enclosing the deep trench 11. The second conductivity is the opposite of the first conductivity type. For example, the first conductivity type may be p-type and the second conductivity type may be n-type, or vice versa. Examples of the dopants include B, Ga, In, P, As, Sb, etc. The dopants may be introduced by ion implantation, plasma doping, or outdiffusion from a dopant containing material such as arsenosilicate glass (ASG), borosilicate glass (BSG), phosphosilicate glass (PSG), etc. The lateral width w of the buried plate may be from about 20 nm to about 400 nm, and typically from about 50 nm to about 200 nm, although lesser and greater widths are contemplated herein. The dopant concentration of the buried plate 12 may be from about $1.0\times10^{17}/cm^3$ to about $1.0\times10^{21}/cm^3$, and typically from about $1.0\times10^{18}/cm^3$ to about $1.0\times10^{20}/cm^3$.

Referring to FIG. 2, a node dielectric layer 14L is formed directly on the buried plate 12, sidewalls of the buried insulator layer 20, sidewalls of the top semiconductor layer 30, and sidewalls and top surfaces of the pad dielectric layer 40 by methods known in the art including, but not limited to, thermal oxidation, thermal nitridation, chemical vapor deposition (CVD), atomic layer deposition (ALD), or a combination of thereof. The node dielectric layer 14L may comprise silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the node dielectric layer 14L may be from about 3 nm to about 10 nm, although lesser and greater thickness are also explicitly contemplated herein.

A conductive material layer 16L is formed directly on the node dielectric layer 14L within the deep trench 11 and over the top surface of the dielectric pad layer 40. The conductive material layer 16L may consist of a polycrystalline or amorphous doped semiconductor layer, or may comprise a metallic inner electrode layer (not shown separately) and a polycrystalline or amorphous doped semiconductor layer (not shown separately). Alternately, the conductive material layer 16L may comprise a plurality of metallic inner electrode layers, each separated from another by at least one polycrystalline or amorphous doped semiconductor layer, or a plurality of polycrystalline or amorphous doped semiconductor layers, each separated from another by at least one metallic inner electrode layer.

A metallic inner electrode layer comprises a conductive metallic material such as transition elements (i.e., elements in group III B, group IVB, group V B, group VI B, group VII B, group VIII B, Lanthanides, and Actinides), Al, Ga, In, Tl, Sn, Pb, Bi, an alloy thereof, a conductive nitride thereof, or an alloy of conductive nitrides thereof. For example, the metallic inner electrode layer may comprise Ti, Ta, W, Cu, Co, TiN, TaN, WN, etc. The metallic inner electrode layer may be formed by chemical vapor deposition (CVD), physical vapor deposition (PVD), atomic layer deposition, etc. The deposition process employed for formation of the metallic inner electrode layer may be conformal or non-conformal. The thickness of the metallic inner may be from about 5 nm to about 100 nm, and typically from about 10 nm to about 50 nm, although lesser and greater thicknesses are contemplated herein.

A polycrystalline or amorphous doped semiconductor layer comprises a doped semiconductor material including, but not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The polycrystalline or amorphous doped semiconductor layer may have a doping of the first conductivity type or the second conductivity type, i.e., p-type or n-type. The dopant concentration of the polycrystalline or amorphous doped semiconductor layer may be from about $1.0 \times 10^{18}/cm^3$ to about $1.0 \times 10^{21}/cm^3$, and typically from $3.0 \times 10^{19}/cm^3$ to about $5.0 \times 10^{20}/cm^3$, although lesser and greater dopant concentrations are also contemplated herein.

The polycrystalline or amorphous doped semiconductor layer may be formed by chemical vapor deposition (CVD), physical vapor deposition (PVD), atomic layer deposition, etc. The deposition process employed for formation of the polycrystalline or amorphous doped semiconductor layer may be conformal or non-conformal. The doping of the polycrystalline or amorphous doped semiconductor layer may be effected by in-situ doping, or by layered doping in which at least one layer of dopants is incorporated within the polycrystalline or amorphous doped semiconductor layer during deposition.

Figure 3:
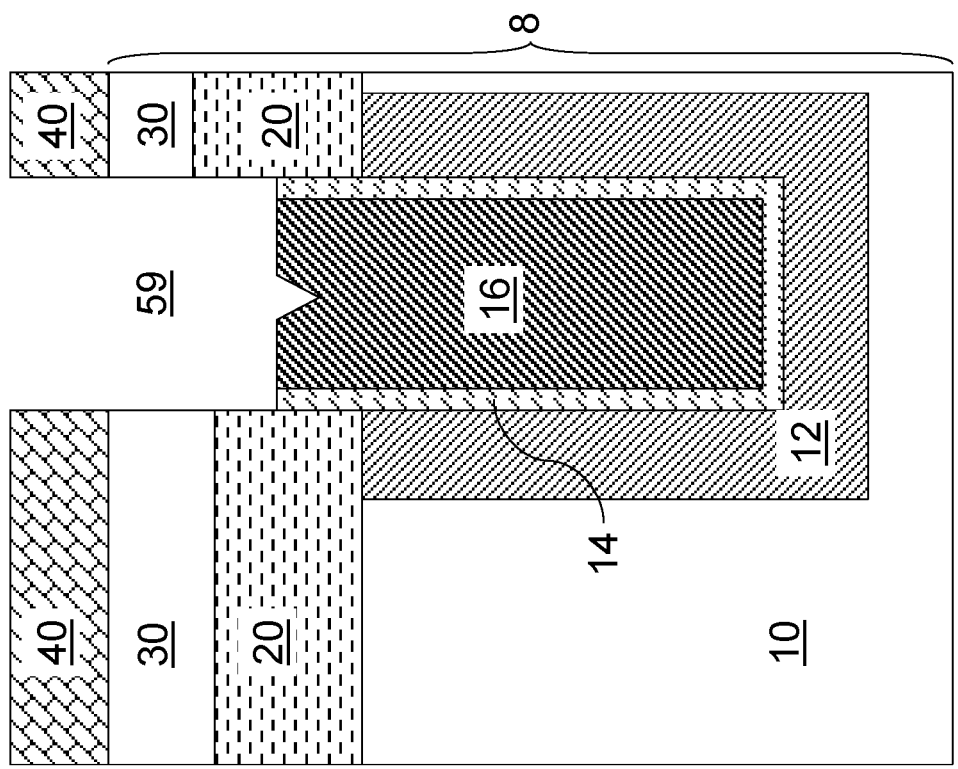

Referring to FIG. 3, the portions of the conductive material layer 16L and the node dielectric layer 14L above the top surface of the pad dielectric layer 40 are removed by planarization, which may employ chemical mechanical planarization (CMP) or an etch. The conductive material layer 16L and the node dielectric layer 14L are further recessed into the deep trench 11 so that top surfaces of the remaining portions of the conductive material layer 16L and the node dielectric layer 14L are located between the top surface of the buried insulator layer 20 and the bottom surface of the buried insulator layer 20. The remaining portion of the node dielectric layer 14L constitutes a node dielectric 14. The remaining portion of the conductive material layer 16L constitute an inner electrode 16, which may consist of a polycrystalline or amorphous doped semiconductor material and/or a conductive metallic material. The top surface of the inner electrode 16 may, or may not, comprise a divot, which corresponds to a seam at which two growth surfaces for the conductive material layer 16L meet during the deposition step. A strap cavity 59 is formed within the deep trench 11 between the top surface of the inner electrode 16 and the top surface of the pad dielectric layer 40.

Figure 4:
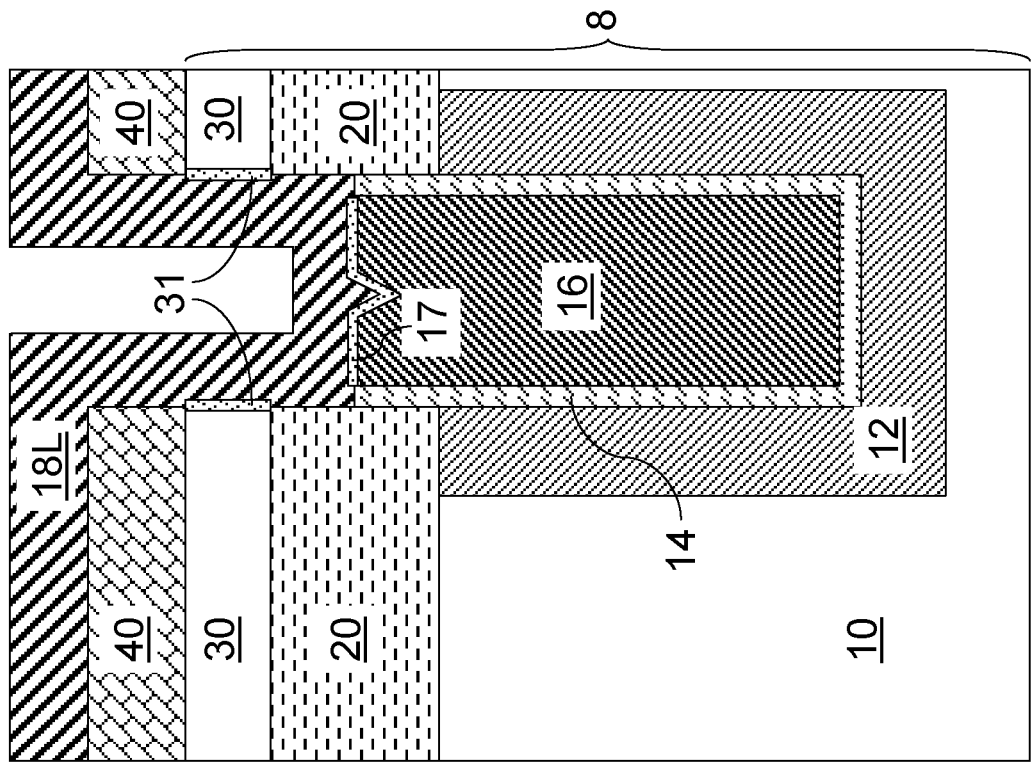

Referring to FIG. 4, the top surface of the inner electrode 16 and the exposed sidewalls of the top semiconductor layer 30 are subjected to an oxidation process and/or a nitridation process. The oxidation and/or nitridation process may be a thermal process, chemical process, and/or a plasma enhanced process. For example, the oxidation and/or nitridation process may comprise a thermal oxidation process, a chemical oxidation, a thermal nitridation process, a plasma oxidation process, and/or a plasma nitridation process. The oxidation and/or nitridation process converts a surface portion of the inner electrode 16 into a first interfacial dielectric layer 17, and converts a surface portion of the top semiconductor layer 30, i.e., the sidewalls of the top semiconductor layer 30, into a second interfacial dielectric layer 31. The formation of the first interfacial dielectric layer 17 and the second interfacial dielectric layer 31 by conversion of the underlying semiconductor materials is performed simultaneously. The thickness of the first interfacial dielectric layer 17 and the second interfacial dielectric layer 31 may be from about 0.1 nm to about 1.0 nm, and typically from about 0.3 nm to about 0.6 nm. At such small thicknesses, the first interfacial dielectric layer 17 and the second interfacial dielectric layer 31 have large enough leakage current so that the first interfacial dielectric layer 17 and the second interfacial dielectric layer 31 do not provide substantial resistance to electrical conduction, i.e., do not impede electrical current substantially.

A doped semiconductor material layer 18L is deposited on the top surface and the sidewalls of the pad dielectric layer 40, the second interfacial dielectric layer 31, the sidewalls of the buried insulator layer 20, the top portion of the node dielectric 14, and the first interfacial dielectric layer 17. In case the inner electrode 16 comprises a polycrystalline or amorphous doped semiconductor material, the doped semiconductor material layer 18L has the same type of doping as the polycrystalline or amorphous doped semiconductor material. The width of the doped semiconductor layer 18L, as measured on the sidewalls of the top semiconductor layer 30, is less than one half of the width of the strap cavity 59, and consequently, the doped semiconductor material layer 18L does not fills the strap cavity 59 completely.

Exemplary doped semiconductor materials that may be employed for the doped semiconductor layer 18L include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The doped semiconductor layer 18L may be polycrystalline or amorphous. The dopant concentration of the doped semiconductor material layer 18L may be from about $1.0 \times 10^{18}/cm^3$ to about $1.0 \times 10^{21}/cm^3$, and typically from $3.0 \times 10^{19}/cm^3$ to about $5.0 \times 10^{20}/cm^3$, although lesser and greater dopant concentrations are also contemplated herein. The doped semiconductor material layer 18L may be formed by chemical vapor deposition (CVD), physical vapor deposition (PVD), atomic layer deposition, etc. The deposition process employed for formation of the doped semiconductor material layer 18L may be conformal or non-conformal.

Referring to FIG. 5, an anisotropic etch such as reactive ion etch (RIE) is employed to remove horizontal portions of the doped semiconductor material layer 18L. Preferably but not necessarily, the anisotropic etch is selective to the pad dielectric layer 40. The doped semiconductor material layer 18L is completely removed from the top surface of the pad dielectric layer 40. Further, a portion of the doped dielectric semiconductor material layer 18L is removed from above a center portion of the inner electrode 16. A center portion of the first interfacial dielectric layer may, or may not, be removed by the anisotropic etch. The remaining portion of the doped semiconductor material layer 18L located on the sidewalls of the pad dielectric layer 40, the second interfacial dielectric layer 31, the sidewalls of the buried insulator layer 20, the top portion of the node dielectric 14, and the outer portion of the first interfacial dielectric layer 17 constitute a conductive strap spacer 18. The conductive strap spacer 18 laterally encircles the strap cavity 59, which is the void above the center portion of the inner electrode 16. Typically, the conductive strap spacer 18 is of unitary construction, i.e., in one piece, and is topologically homeomorphic to a torus, i.e., ring-shaped.

Referring to FIG. 6, a photoresist 47 is applied over the pad dielectric layer 40 and the deep trench and is lithographically patterned to cover one side of the deep trench, while exposing the opposite side of the deep trench. Employing the photoresist 47 as an etch mask, exposed portions of the pad dielectric layer 40 is removed by an etch, which may be an isotropic etch or an anisotropic etch. The etch employed to removed the pad dielectric layer 40 may be a wet etch or a dry etch. The exposed portions of the conductive strap spacer 18 and the exposed portions of the top semiconductor layer 30 are also removed by another isotropic etch or another anisotropic etch. The etch employed to remove the exposed portions of the conductive strap spacer 18 and the exposed portions of the top semiconductor layer 30 may be a wet etch or a dry etch. An exposed portion of the first interfacial dielectric layer 17 may also be removed. Optionally, a portion of the inner electrode 16 may be removed outside the area covered by the photoresist 47. The conductive strap spacer 18 is preserved underneath the photoresist 47, and is removed from outside the area covered by the photoresist 47. Thus, the conductive strap spacer 18 is present on one side of the deep trench but is absent on the opposite side of the deep trench. A top surface and a sidewall of the buried insulator layer 20 are exposed outside the area covered by the photoresist 47. The photoresist 47 is subsequently removed. The region from which the top semiconductor layer 30 is removed and the region containing the strap cavity 59 collectively constitute a shallow trench.

The top semiconductor layer 30, the second interfacial dielectric layer 31, the conductive strap spacer 18, the first interfacial dielectric layer 17, and the inner electrode 16 form an electrically conductive path for electrical current. The first interfacial dielectric layer 17 abuts a top surface of the inner electrode 16 and a bottom surface of the conductive strap spacer 18. The second interfacial dielectric layer 31 abuts a sidewall of the top semiconductor layer 30 and a sidewall of said conductive strap spacer 18. The second interfacial dielectric layer 31 prevents epitaxial alignment of the semiconductor material in the conductive strap spacer 18 to the single crystalline structure of the first semiconductor layer 30 during subsequent high temperature processing steps. By preventing such epitaxial alignment of the semiconductor material in the conductive strap spacer 18, formation of structural defects such as dislocations are avoided in the top semiconductor layer 30, and a phenomenon known as variable retention time (VRT), in which the retention time of a deep trench capacitor varies in time, is avoided.

Figure 7:
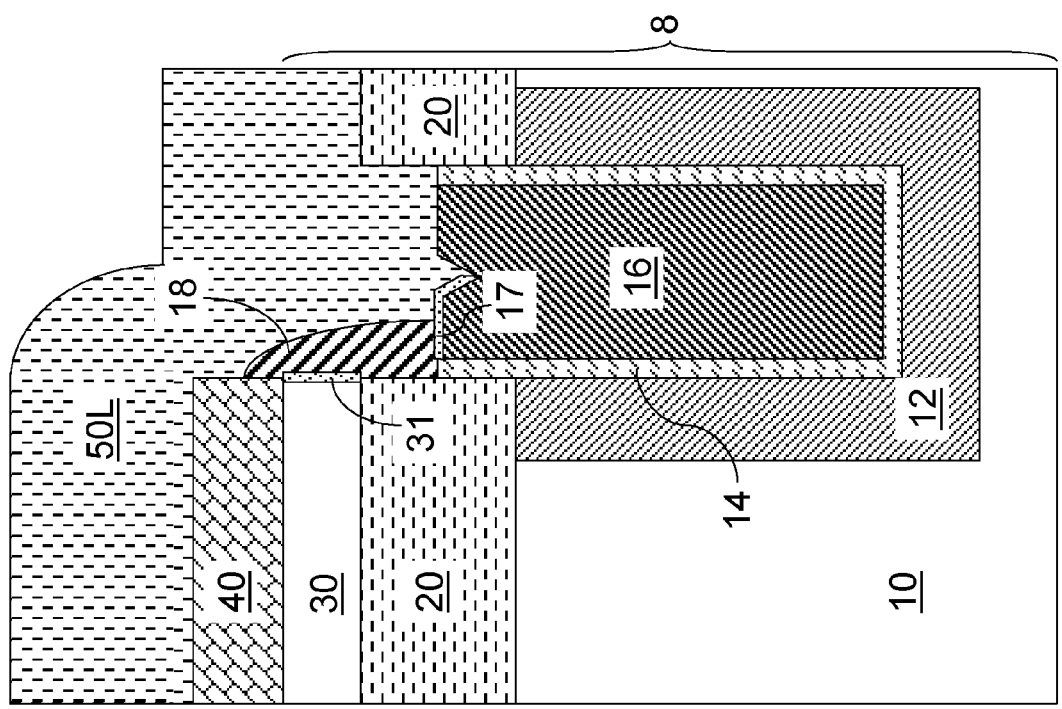

Referring to FIG. 7, a shallow trench dielectric layer 50L is deposited into the shallow trench and over the top surface of the pad dielectric layer 40. The shallow trench dielectric layer 50L comprises a dielectric material such as dielectric oxide, dielectric nitride, dielectric oxynitride, or a combination thereof. Exemplary dielectric materials include silicon oxide, silicon nitride, silicon oxynitride, etc. The thickness of the shallow trench dielectric layer 50L, as measured over the area in which the shallow trench dielectric layer 50L is deposited directly on a top surface of the buried insulator layer 20, is greater than the sum of the thickness of the top semiconductor layer 30 and the thickness of the pad dielectric layer 40.

Figure 8:
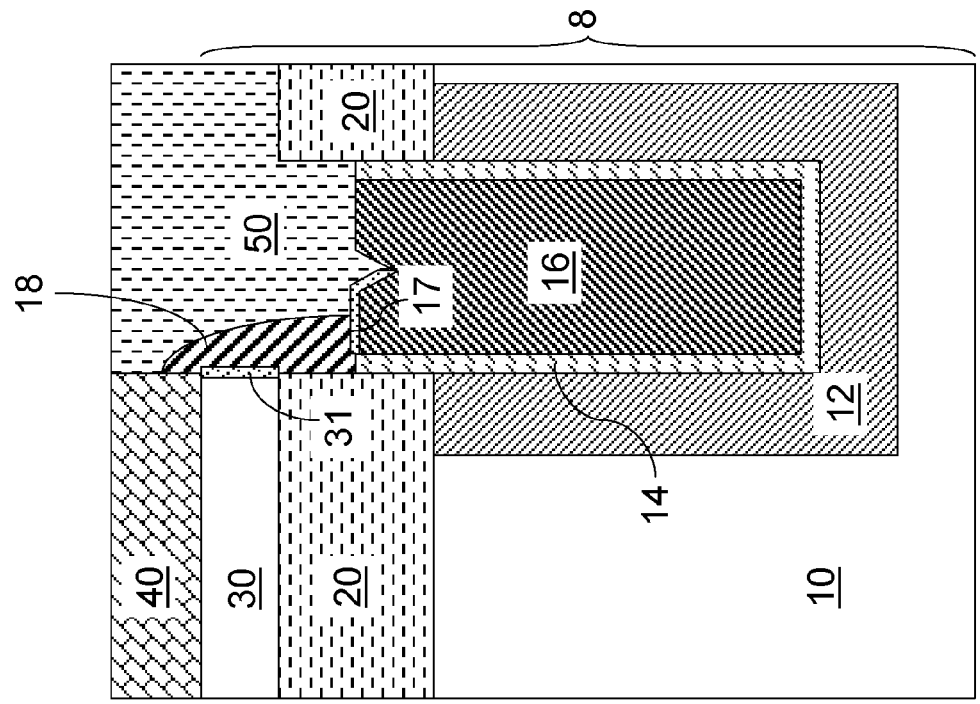

Referring to FIG. 8, the shallow trench dielectric layer 50L is planarized employing chemical mechanical planarization (CMP), recess etch, or a combination thereof. The pad dielectric layer 40 may be employed as a stopping layer during the planarization processing step. The remaining portion of the shallow trench dielectric layer 50L after planarization constitutes a shallow trench isolation structure 50, which has a top surface that is substantially coplanar with the top surface of the pad dielectric layer 40. The entirety of the conductive strap spacer 18 is located underneath the shallow trench isolation structure 50. The shallow trench isolation structure 50 abuts the conductive strap spacer 18 and the pad dielectric layer 40. The shallow trench isolation structure 50 overlies an entirety of the deep trench at this step.

Figure 9:
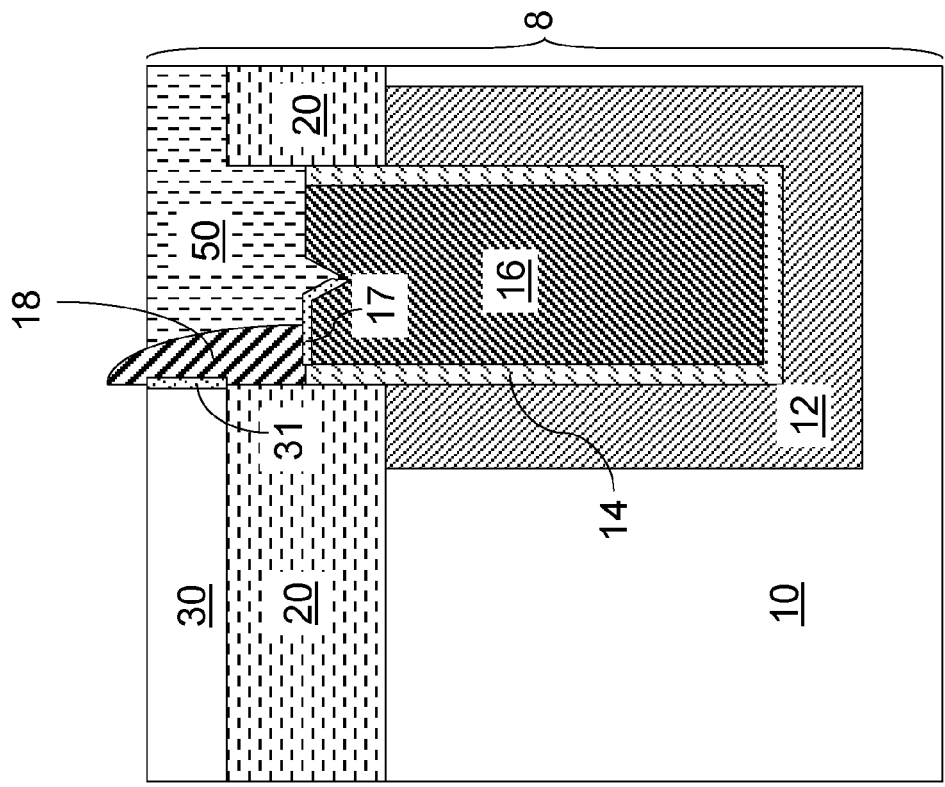

Referring to FIG. 9, the shallow trench isolation structure 50 is recessed relative to the top surface of the pad dielectric layer 40 to a depth that is substantially coplanar with the top surface of the top semiconductor layer 30. A wet etch or a dry etch may be employed to recess the shallow trench isolation structure 50. Preferably, the etch process employed to recess the shallow trench isolation structure 50 is selective to the conductive strap spacer 18. Subsequently, the pad dielectric layer 40 is removed, for example, by at least one wet etch, selective to the top semiconductor layer 30, the conductive strap spacer 18, and the shallow trench isolation structure 50. At this step, the top surface of the top semiconductor layer 30 and the top surface of the shallow trench isolation structure 50 are substantially coplanar. A top portion of the conductive strap spacer 18 protrudes above the top surface of the top semiconductor layer 30. The top portion of the conductive strap spacer 18 has a substantially vertical sidewall adjoined to the top semiconductor layer 30 and a convexly curved sidewall adjoined to the top surface of the shallow trench isolation structure 50.

Figure 10:
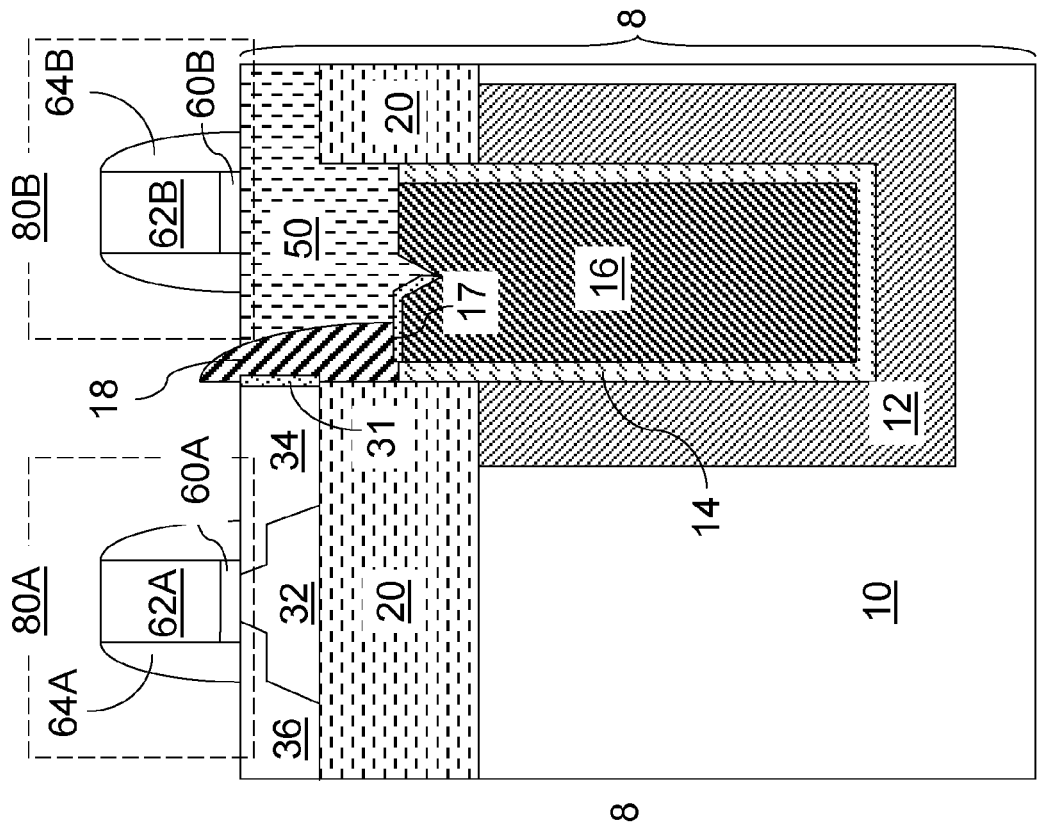

Referring to FIG. 10, at least one semiconductor device is formed in and/or on the top semiconductor layer 30. At least another semiconductor device may be formed on the top surface of the shallow trench isolation structure 50. For example, an access transistor may be formed on a portion of the top semiconductor layer 30 that abuts the second interfacial dielectric layer 31. Specifically, a source region 34 of the access transistor laterally abuts the second interfacial dielectric layer 31. The access transistor comprises an active word line 80A located over the top semiconductor layer 30 and including an active gate dielectric portion 60A, an active gate conductor portion 62A, and an active gate spacer portion 64A. The access transistor further comprises a body region 32, the source region 34, and a drain region 36 located within the top semiconductor layer 30. A passing gate line 80B may be formed over the shallow trench isolation structure 50. The passing gate line 80B includes a passing gate dielectric portion 60B, a passing gate conductor portion 62B, and a passing gate spacer portion 64B.

Figure 11:
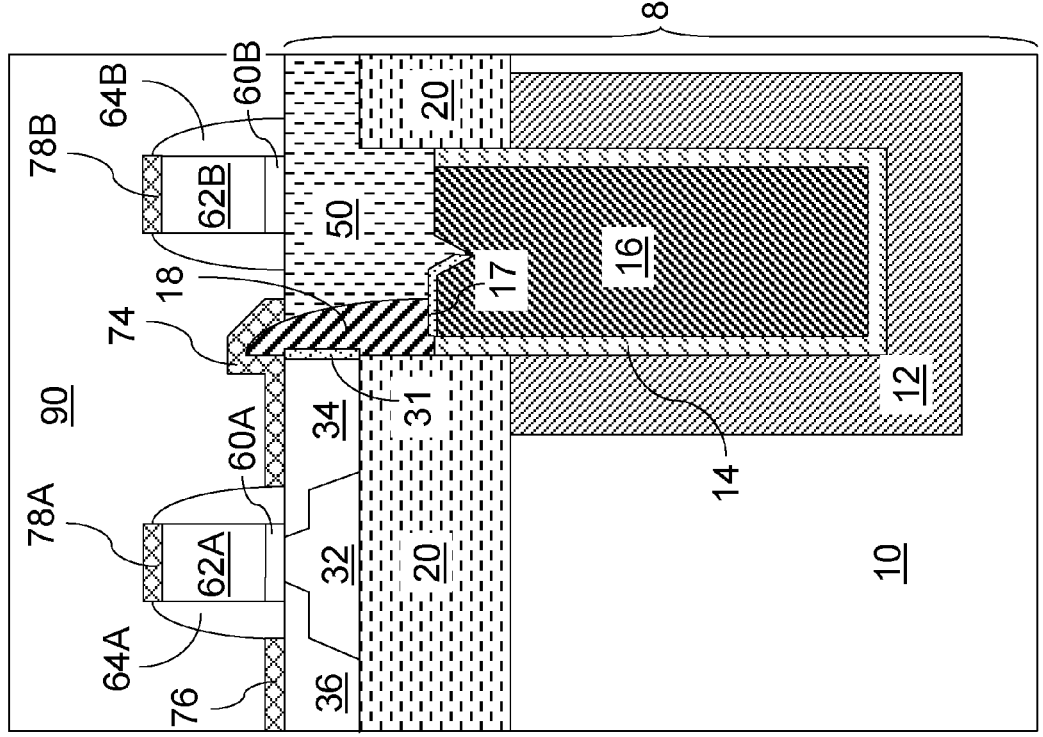

Referring to FIG. 11, various metal semiconductor alloy regions are formed by deposition of a metal layer and inducing reaction of the metal layer with underlying portions of a semiconductor material. Unreacted portions of the metal layer are subsequently removed. Specifically, an active gate metal semiconductor alloy region 78A is formed directly on the active gate conductor portion 62A. A passing gate metal semiconductor alloy region 78B is formed directly on the passing gate conductor portion 62B. A drain side metal semiconductor alloy region 76 is formed directly on the drain region 36. A strap metal semiconductor alloy region 74 is formed directly on the top surface of the source region 34 and on the entirety of the exposed surfaces of the top portion of the conductive strap spacer 18 above the top surface of the source region 34. Each of the various metal semiconductor alloy regions (78A, 78B, 76, 74) comprises an alloy of a metal and a semiconductor material. In case the active gate conductor portion 62A, the passing gate conductor portion 62B, the drain region 36, the source region 34, and/or the conductive strap spacer 18 comprise silicon, the an active gate metal semiconductor alloy region 78A, the passing gate metal semiconductor alloy region 78B, the drain side metal semiconductor alloy region 76, and/or the strap metal semiconductor alloy region 74 comprise a metal silicide, for example, nickel silicide, cobalt silicide, titanium silicide, etc.

The strap metal semiconductor alloy region 74 provides a reliable electrical connection between the source region 32 and the conductive strap spacer 18. The resistance of the strap metal semiconductor alloy region 74 does not depend on any recess depth, as is the case with prior art structures, or any lithographic overlay variations. Furthermore, since the resistivity of a metal semiconductor alloy is typically at least one order of magnitude lower than the resistivity of any heavily doped semiconductor material, the strap metal semiconductor alloy region 74 provides a low resistance electrical path between the source region 34 and the conductive strap spacer 18. The inner electrode 16, the node dielectric 14, and the buried plate 12 collectively comprise a deep trench capacitor (16, 14, 12). The inner electrode 16 of the deep trench capacitor (16, 14, 12) is electrically coupled to the source region 34 of the access transistor through a low resistance conductive path that includes a first interfacial dielectric layer 17, the conductive strap spacer 18, and the parallel connection of the second interfacial dielectric layer 31 and the strap metal semiconductor alloy region 74. The entirety of the strap metal semiconductor alloy region 74 is located above the source region 34 and the shallow trench isolation structure 50.

While the present invention is described with a strap metal semiconductor alloy region 74 electrically connecting the conductive strap spacer 18 with the source region 34, embodiments of the present invention in which a strap metal semiconductor alloy region electrically connects a conductive strap spacer to any other components of a semiconductor device formed in a top semiconductor layer are also explicitly contemplated herein.

A middle-of-line (MOL) dielectric layer 90, which may include a mobile ion barrier layer (not shown), is deposited over the active word line (60A, 62A, 64A, 78A), the passing word line (60B, 62B, 64B, 78B), the drain side metal semiconductor alloy region 76, the strap metal semiconductor alloy region 74, and the shallow trench isolation structure 50. The MOL dielectric layer 90 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes (not shown) are formed in the MOL dielectric layer 90 and filled with metal to from various contact vias (not shown).

Figure 12:
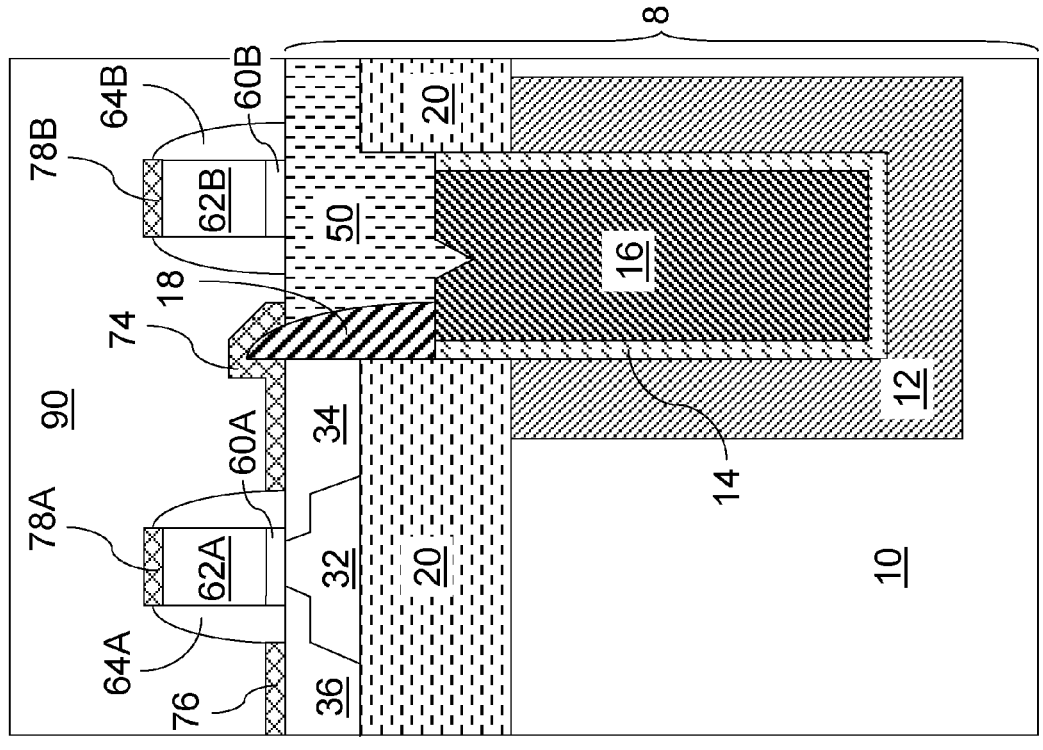
FIG. 12 is a vertical cross-sectional view of a second exemplary semiconductor structure according to a second embodiment of the present invention.

Referring to FIG. 12, a second exemplary semiconductor structure according to a second embodiment of the present invention is derived from the first exemplary semiconductor structure by omitting the processing steps employed to form the first interfacial dielectric layer 17 and the second interfacial dielectric layer 31. Thus, at the processing step corresponding to FIG. 4, the doped semiconductor material layer 18L is deposited directly on the top surface and the sidewalls of the pad dielectric layer 40, the sidewalls of the top semiconductor layer 30, the sidewalls of the buried insulator layer 20, the top portion of the node dielectric 14, and the top surface of the inner electrode 16. The same processing steps may be employed thereafter as in the first embodiment.

The inner electrode 16, the node dielectric 14, and the buried plate 12 collectively comprise a deep trench capacitor (16, 14, 12). The conductive strap spacer 18 vertically abuts the top surface of the inner electrode 16 and laterally abuts a sidewall of the top semiconductor layer 30, which may be a source region 34 of an access transistor for the deep trench capacitor (16, 14, 12). The inner electrode 16 of the deep trench capacitor (16, 14, 12) is electrically coupled to the source region 34 of the access transistor through a low resistance conductive path that includes the conductive strap spacer 18 and the strap metal semiconductor alloy region 74. The entirety of the strap metal semiconductor alloy region 74 is located above the source region 34 and the shallow trench isolation structure 50.

Referring to FIG. 13, a third exemplary semiconductor structure according to a third embodiment of the present invention is derived from the first exemplary semiconductor structure according to the first embodiment of the present invention in FIG. 2. Specifically, the portions of the conductive material layer 16L and the node dielectric layer 14L above the top surface of the pad dielectric layer 40 are removed by planarization, which may employ chemical mechanical planarization (CMP) or an etch. The remaining portion of the node dielectric layer 14L at this point constitutes a node dielectric 14'. The conductive material layer 16L is further recessed into the deep trench 11 so that top surface of the remaining portions of the conductive material layer 16L is located between the top surface of the buried insulator layer 20 and the bottom surface of the buried insulator layer 20. The remaining portion of the conductive material layer 16L constitute an inner electrode 16, which may consist of a polycrystalline or amorphous doped semiconductor material and/or a conductive metallic material. The top surface of the inner electrode 16 may, or may not, comprise a divot, which corresponds to a seam at which two growth surfaces for the conductive material layer 16L meet during the deposition step.

The etch employed to recess the conductive material layer 16L beneath the top surface of the pad dielectric layer 40L is selective to the node dielectric 14'. Therefore, while the conductive material layer 16L is recessed into the deep trench 11, the node dielectric layer 14L is not recessed. The top portion of the node dielectric 14' is substantially coplanar with the top surface of the pad dielectric layer 40. A strap cavity 59 is formed within the deep trench 11 between the top surface of the inner electrode 16 and the top surface of the pad dielectric layer 40. The strap cavity 59 is laterally surrounded by the node dielectric 14'.

Referring to FIG. 14, a doped semiconductor material layer 18L is deposited on the top surface of the pad dielectric layer 40, the sidewalls of the node dielectric 14', and the top surface of the inner electrode 16. In case the inner electrode 16 comprises a polycrystalline or amorphous doped semiconductor material, the doped semiconductor material layer 18L has the same type of doping as the polycrystalline or amorphous doped semiconductor material. The width of the doped semiconductor layer 18L, as measured on the sidewalls of the node dielectric 14', is less than one half of the width of the strap cavity 59 prior to deposition of the doped semiconductor material layer 18L, and consequently, the doped semiconductor material layer 18L does not fills the strap cavity 59 completely.

The same doped semiconductor materials may be employed for the doped semiconductor layer 18L as in the first embodiment. The dopant concentration of the doped semiconductor material layer 18L may be the same as in the first embodiment. The doped semiconductor material layer 18L may be formed by the same processing steps as in the first embodiment.

Figure 15:
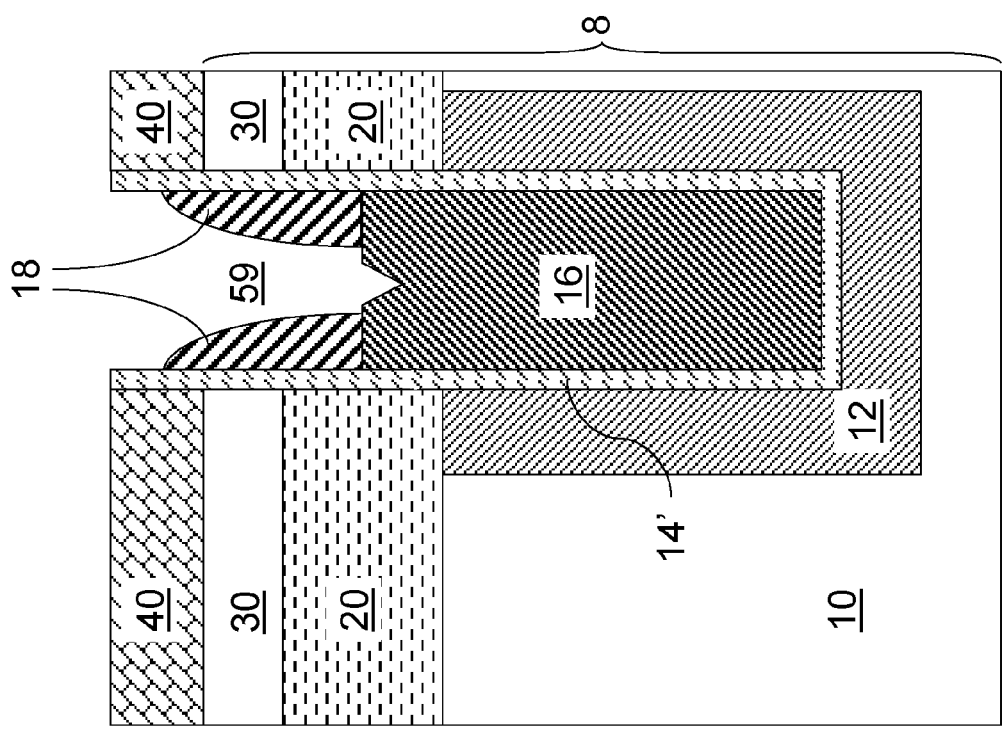

Referring to FIG. 15, an anisotropic etch such as RIE is employed to remove horizontal portions of the doped semiconductor material layer 18L. Preferably but not necessarily, the anisotropic etch is selective to the pad dielectric layer 40. The doped semiconductor material layer 18L is completely removed from the top surface of the pad dielectric layer 40. Further, a portion of the doped dielectric semiconductor material layer 18L is removed from above a center portion of the inner electrode 16. The remaining portion of the doped semiconductor material layer 18L located directly on the sidewalls of the node dielectric 14' and outer portions of the top surface of the inner electrode 16 constitute a conductive strap spacer 18. The conductive strap spacer 18 laterally encircles the strap cavity 59, which is the void above the center portion of the inner electrode 16. Typically, the conductive strap spacer 18 is of unitary construction, i.e., in one piece, and is topologically homeomorphic to a torus, i.e., ring-shaped.

Figure 16:
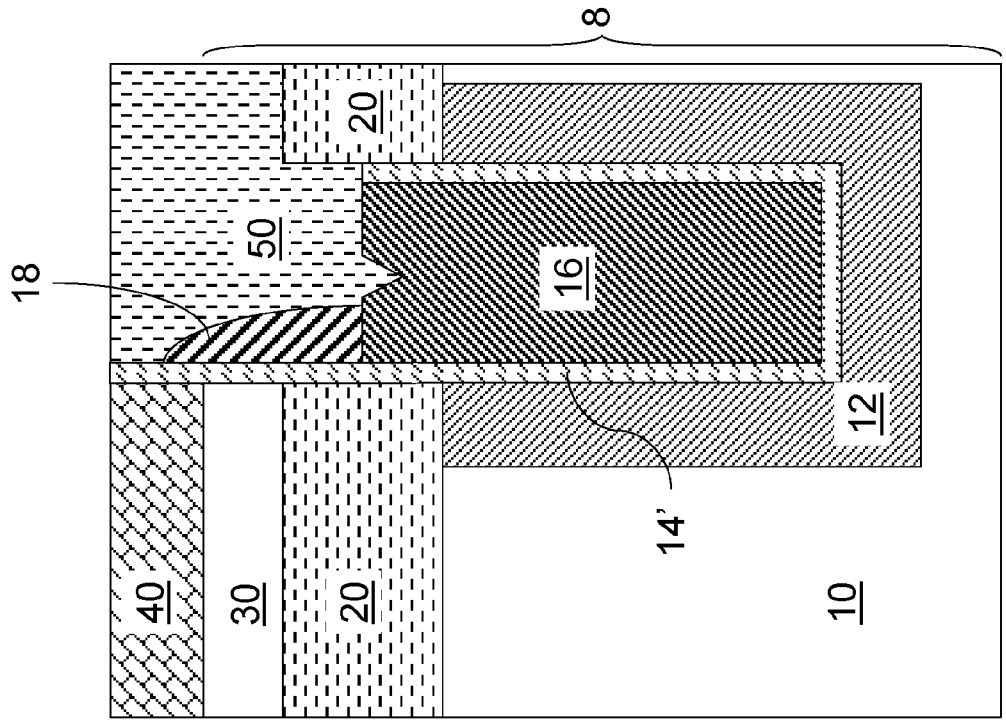

Referring to FIG. 16, the same processing methods may be employed to pattern a shallow trench, to deposit shallow trench dielectric layer 50L (See FIG. 7), and to form a shallow trench isolation structure 50 as in the first embodiment. The remaining portion of the shallow trench dielectric layer 50L after planarization constitutes a shallow trench isolation structure 50, which has a top surface that is substantially coplanar with the top surface of the pad dielectric layer 40. A top surface of the node dielectric 14' may be coplanar with the top surface of the pad dielectric layer 40 and the top surface of the shallow trench isolation structure 50. The entirety of the conductive strap spacer 18 is located underneath the shallow trench isolation structure 50. The shallow trench isolation structure 50 abuts the conductive strap spacer 18 and node dielectric 14'. The shallow trench isolation structure 50 overlies an entirety of the deep trench at this step excluding the area occupied by a portion of the node dielectric 14' that abuts the top semiconductor layer 30.

Referring to FIG. 17, the shallow trench isolation structure 50 is recessed relative to the top surface of the pad dielectric layer 40 to a depth that is substantially coplanar with the top surface of the top semiconductor layer 30. A wet etch or a dry etch may be employed to recess the shallow trench isolation structure 50. Preferably, the etch process employed to recess the shallow trench isolation structure 50 is selective to the conductive strap spacer 18. Subsequently, the pad dielectric layer 40 and an upper portion of the node dielectric 14' are removed, for example, by at least one wet etch, selective to the top semiconductor layer 30, the conductive strap spacer 18, and the shallow trench isolation structure 50. In case the pad dielectric layer 40 and the node dielectric 14' comprise a substantially same material, e.g., silicon nitride, the pad dielectric layer 40 and an upper portion of the node dielectric 14' are removed at the same processing step. At this step, the top surface of the top semiconductor layer 30 and the top surface of the shallow trench isolation structure 50 are substantially coplanar. The top surface of the node dielectric 14' as recessed may be substantially coplanar with the top surface of the top semiconductor layer 30. A top portion of the conductive strap spacer 18 protrudes above the top surface of the top semiconductor layer 30. The top portion of the conductive strap spacer 18 has a substantially vertical sidewall adjoined to the node dielectric 14' and a convexly curved sidewall adjoined to the top surface of the shallow trench isolation structure 50.

At least one semiconductor device is formed in and/or on the top semiconductor layer 30. At least another semiconductor device may be formed on the top surface of the shallow trench isolation structure 50. For example, an access transistor may be formed on a portion of the top semiconductor layer 30 that abuts the node dielectric 14'. Specifically, a source region 34 of the access transistor laterally abuts the node dielectric 14'. The access transistor comprises an active word line 80A located over the top semiconductor layer 30 and including an active gate dielectric portion 60A, an active gate conductor portion 62A, and an active gate spacer portion 64A. The access transistor further comprises a body region 32, the source region 34, and a drain region 36 located within the top semiconductor layer 30. A passing gate line 80B may be formed over the shallow trench isolation structure 50. The passing gate line 80B includes a passing gate dielectric portion 60B, a passing gate conductor portion 62B, and a passing gate spacer portion 64B.

Referring to FIG. 18, a divot 19 is formed between the source region 34 and the conductive strap spacer 18 by removing a top portion of the node dielectric 14' from below a top surface of the source region 34 by an etch. The etch is selective to the source region 34, the shallow trench isolation structure 50, the conductive strap spacer 18, the exposed surfaces of the active word line 80A, and the exposed surfaces of the passing word line 80B. For example, if the node dielectric 14' comprises silicon nitride and if the shallow trench isolation structure 50, the active gate spacer portion 64A, and the passing gate spacer portion 64B comprise silicon oxide, a wet etch employing hot phosphoric acid may be employed. The bottom of the divot 19 may be above, at the same level as, or below the top surface of the buried insulator layer 20. Preferably, the bottom of the divot is at the same level as, or below the top surface of the buried insulator layer 20 to maximize the conductive path to be provided by subsequent metallization.

Figures 19, 20:
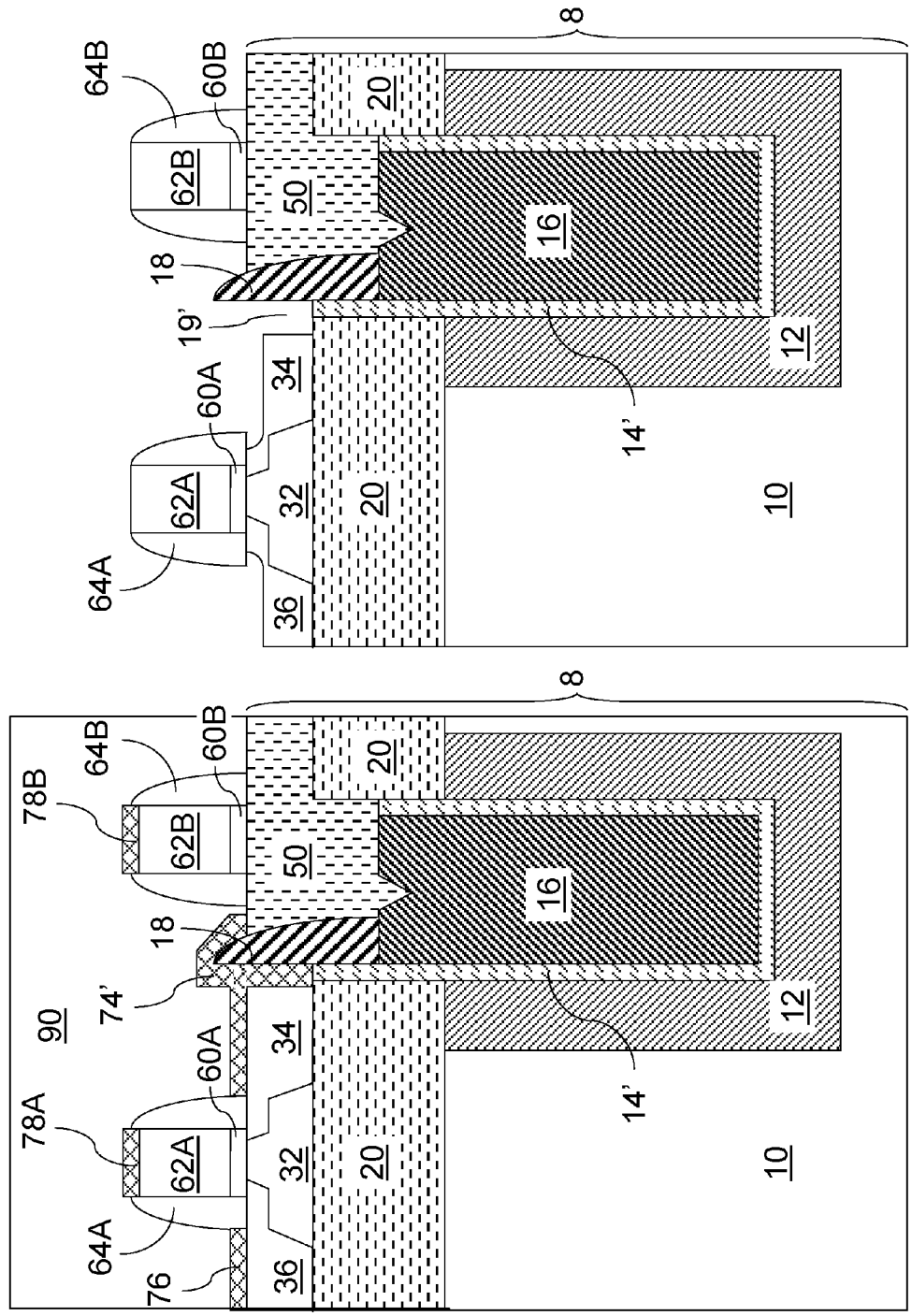

Referring to FIG. 19, various metal semiconductor alloy regions are formed by deposition of a metal layer and inducing reaction of the metal layer with underlying portions of a semiconductor material. Unreacted portions of the metal layer are subsequently removed. Specifically, an active gate metal semiconductor alloy region 78A is formed directly on the active gate conductor portion 62A. A passing gate metal semiconductor alloy region 78B is formed directly on the passing gate conductor portion 62B. A drain side metal semiconductor alloy region 76 is formed directly on the drain region 36. A strap metal semiconductor alloy region 74' is formed directly on the top surface of the source region 34, the sidewall of the source region 34, the substantially vertical sidewall of the conductive strap spacer 18, and on the entirety of the exposed surfaces of the top portion of the conductive strap spacer 18 above the top surface of the source region 34. Preferably, the strap metal semiconductor alloy region 74' extends to the top surface of the buried insulator layer 20 so that the strap metal semiconductor alloy region 74 abuts the buried insulator layer 20 and the node dielectric 14'. Each of the various metal semiconductor alloy regions (78A, 78B, 76, 74') comprise an alloy of a metal and a semiconductor material. In case the active gate conductor portion 62A, the passing gate conductor portion 62B, the drain region 36, the source region 34, and/or the conductive strap spacer 18 comprise silicon, the an active gate metal semiconductor alloy region 78A, the passing gate metal semiconductor alloy region 78B, the drain side metal semiconductor alloy region 76, and/or the strap metal semiconductor alloy region 74' comprise a metal silicide.

The strap metal semiconductor alloy region 74' provides a reliable electrical connection between the source region 32 and the conductive strap spacer 18. The resistance of the strap metal semiconductor alloy region 74' does not depend on any recess depth, as is the case with prior art structures, or any lithographic overlay variations. The vertical dimension of the conductive path provided by strap metal semiconductor alloy region 74' is substantially the same as the thickness of the source region 34, which is determined substantially by the thickness of the top semiconductor layer 30 (See FIG. 16). Furthermore, since the resistivity of a metal semiconductor alloy is typically at least one order of magnitude lower than the resistivity of any heavily doped semiconductor material, the strap metal semiconductor alloy region 74' provides a low resistance electrical path between the source region 34 and the conductive strap spacer 18. The inner electrode 16, the node dielectric 14, and the buried plate 12 collectively comprise a deep trench capacitor (16, 14, 12). The inner electrode 16 of the deep trench capacitor (16, 14, 12) is electrically coupled to the source region 34 of the access transistor through a low resistance conductive path that includes the conductive strap spacer 18 and the strap metal semiconductor alloy region 74'. Preferably, the strap metal semiconductor alloy region 74' vertically extends at least to the top surface of the buried insulator layer 20 at the bottom and above the top surface of the conductive strap spacer 18 that protrudes above the top surface of the shallow trench isolation structure 50.

While the present invention is described with a strap metal semiconductor alloy region 74' electrically connecting the conductive strap spacer 18 with the source region 34, embodiments of the present invention in which a strap metal semiconductor alloy region electrically connects a conductive strap spacer to any other components of a semiconductor device formed in a top semiconductor layer are also explicitly contemplated herein.

A middle-of-line (MOL) dielectric layer 90, which may include a mobile ion barrier layer (not shown), is deposited over the active word line (60A, 62A, 64A, 78A), the passing word line (60B, 62B, 64B, 78B), the drain side metal semiconductor alloy region 76, the strap metal semiconductor alloy region 74', and the shallow trench isolation structure 50. The MOL dielectric layer 90 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes (not shown) are formed in the MOL dielectric layer 90 and filled with metal to from various contact vias (not shown).

Referring to FIG. 20, a fourth exemplary semiconductor structure according to a fourth embodiment of the present invention is derived from the third exemplary semiconductor structure of FIG. 18. The divot 19 is subjected to an isotropic etch that removes the sidewall of the source region 34 by a lateral etch, thereby forming an expanded divot 19' having a width greater than the thickness of the node dielectric 14'. A portion of the source region 34 and a portion of the drain region 36, including undercut portions underneath the active gate spacer portion 64B, may be removed by the etch employed to form the expanded divot 19'.

Figure 21:
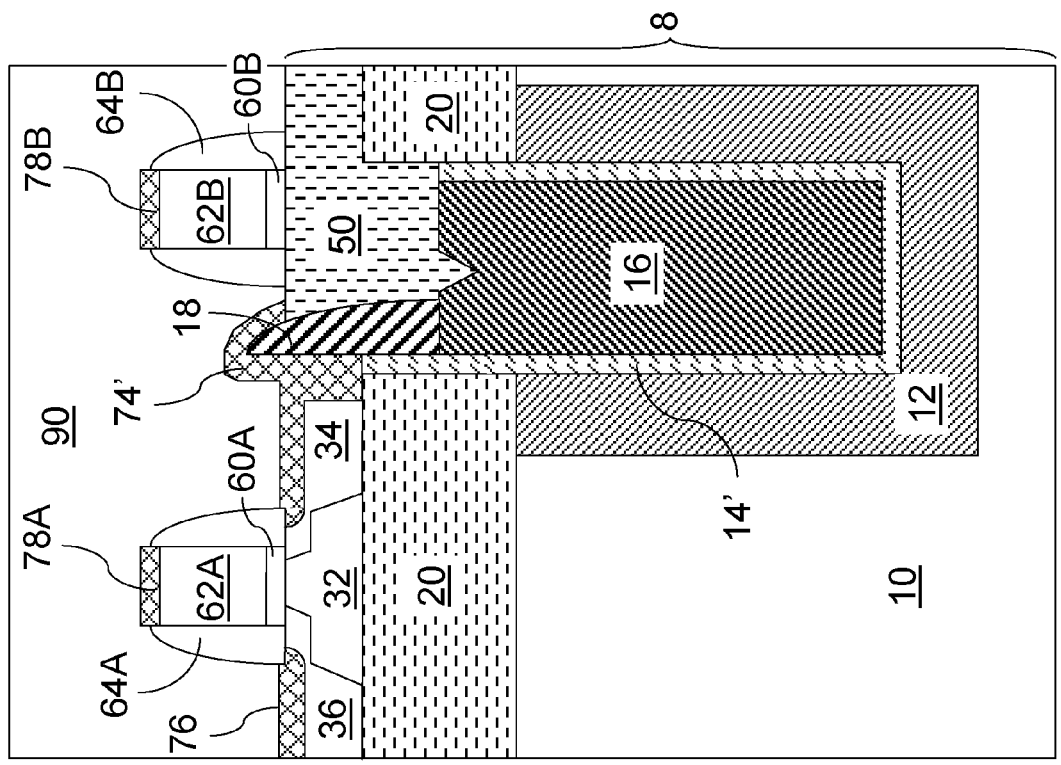

Referring to FIG. 21, various metal semiconductor alloy regions are formed by deposition of a metal layer and inducing reaction of the metal layer with underlying portions of a semiconductor material. Unreacted portions of the metal layer are subsequently removed. An active gate metal semiconductor alloy region 78A, a passing gate metal semiconductor alloy region 78B, and a drain side metal semiconductor alloy region 76 are formed in the same manner as in the third embodiment. A strap metal semiconductor alloy region 74' is formed directly on the top surface of the source region 34, the sidewall of the source region 34, the substantially vertical sidewall of the conductive strap spacer 18, and on the entirety of the exposed surfaces of the top portion of the conductive strap spacer 18 above the top surface of the source region 34, thereby completely filling the expanded divot 19'. Preferably, the strap metal semiconductor alloy region 74' extends to the top surface of the buried insulator layer 20 so that the strap metal semiconductor alloy region 74 abuts the buried insulator layer 20 and the node dielectric 14'. Each of the various metal semiconductor alloy regions (78A, 78B, 76, 74') comprise an alloy of a metal and a semiconductor material.

The strap metal semiconductor alloy region 74' provides a reliable electrical connection between the source region 32 and the conductive strap spacer 18 as in the third embodiment. The resistance of the strap metal semiconductor alloy region 74' does not depend on any recess depth, as is the case with prior art structures, or any lithographic overlay variations. The vertical dimension of the conductive path provided by strap metal semiconductor alloy region 74' is substantially the same as the thickness of the source region 34, which is determined substantially by the thickness of the top semiconductor layer 30 (See FIG. 16). Furthermore, since the resistivity of a metal semiconductor alloy is typically at least one order of magnitude lower than the resistivity of any heavily doped semiconductor material, the strap metal semiconductor alloy region 74' provides a low resistance electrical path between the source region 34 and the conductive strap spacer 18. In comparison with the divot 19 in the third embodiment, the expanded divot 19' is wider, and therefore, allow formation of a wider strip of the strap metal semiconductor alloy region 74' between the source region 34 and the conductive strap spacer 18, thereby reducing the resistance of the conductive path between the source region 34 and the conductive strap spacer 18.

The inner electrode 16, the node dielectric 14, and the buried plate 12 collectively comprise a deep trench capacitor (16, 14, 12). The inner electrode 16 of the deep trench capacitor (16, 14, 12) is electrically coupled to the source region 34 of the access transistor through a low resistance conductive path that includes the conductive strap spacer 18 and the strap metal semiconductor alloy region 74' as in the third embodiment. Preferably, the strap metal semiconductor alloy region 74 vertically extends at least to the top surface of the buried insulator layer 20 at the bottom and above the top surface of the conductive strap spacer 18 that protrudes above the top surface of the shallow trench isolation structure 50.

While the present invention is described with a strap metal semiconductor alloy region 74' electrically connecting the conductive strap spacer 18 with the source region 34, embodiments of the present invention in which a strap metal semiconductor alloy region electrically connects a conductive strap spacer to any other components of a semiconductor device formed in a top semiconductor layer are also explicitly contemplated herein.

A middle-of-line (MOL) dielectric layer 90, which may include a mobile ion barrier layer (not shown), is deposited over the active word line (60A, 62A, 64A, 78A), the passing word line (60B, 62B, 64B, 78B), the drain side metal semiconductor alloy region 76, the strap metal semiconductor alloy region 74', and the shallow trench isolation structure 50. The MOL dielectric layer 90 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes (not shown) are formed in the MOL dielectric layer 90 and filled with metal to from various contact vias (not shown).

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising
   a deep trench located in a semiconductor-on-insulator (SOI) substrate;
   an inner electrode located inside said deep trench and beneath a top surface of a buried insulator layer;
   a conductive strap spacer abutting a sidewall of said buried insulator layer and protruding above a top surface of a top semiconductor layer; and a strap metal semiconductor alloy region abutting said conductive strap spacer and a top surface of said top semiconductor layer.

2. The semiconductor structure of claim 1, wherein said conductive strap spacer comprises a doped semiconductor material having a doping of p-type or n-type and having a polycrystalline or amorphous structure.

3. The semiconductor structure of claim 1, further comprising:
a first interfacial dielectric layer abutting a top surface of said inner electrode and a bottom surface of said conductive strap spacer; and
a second interfacial dielectric layer abutting a sidewall of said top semiconductor layer and a sidewall of said conductive strap spacer.

4. The semiconductor structure of claim 1, wherein said conductive strap spacer abuts a top surface of said inner electrode and a sidewall of said top semiconductor layer.

5. The semiconductor structure of claim 1, wherein said strap metal semiconductor alloy region abuts a sidewall of said top semiconductor layer and a substantially vertical sidewall of said conductive strap spacer beneath said top surface of said top semiconductor layer.

6. The semiconductor structure of claim 5, wherein said strap metal semiconductor alloy region abuts a top surface of said buried insulator layer.

7. The semiconductor structure of claim 1, further comprising a field effect transistor having a source region in said top semiconductor layer, wherein said strap metal semiconductor alloy region abuts said source region and an entirety of said conductive strap spacer above said top surface of said top semiconductor layer.

8. The semiconductor structure of claim 7, wherein said strap metal semiconductor alloy region abuts a bottom surface of a gate spacer of said field effect transistor, a sidewall of said top semiconductor layer, and a substantially vertical sidewall of said conductive strap spacer beneath said top surface of said top semiconductor layer.

9. The semiconductor structure of claim 1, further comprising a shallow trench isolation structure overlying and vertically abutting a portion of said inner electrode and abutting a sidewall of said conductive strap spacer, said strap metal semiconductor alloy region, and said buried insulator layer.

* * * * *